United States Patent
Kapoor et al.

(10) Patent No.: US 9,607,664 B2
(45) Date of Patent: Mar. 28, 2017

(54) LEVERAGING PORTABLE SYSTEM POWER TO ENHANCE MEMORY MANAGEMENT AND ENABLE APPLICATION LEVEL FEATURES

(75) Inventors: Arjun Kapoor, San Francisco, CA (US); Rajeev Nagabhirava, Santa Clara, CA (US); Dhaval Parikh, Santa Clara, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 2561 days.

(21) Appl. No.: 11/863,035

(22) Filed: Sep. 27, 2007

(65) Prior Publication Data
US 2009/0089481 A1   Apr. 2, 2009

(51) Int. Cl.
   G06F 12/02   (2006.01)
   G11C 5/14   (2006.01)
   G11C 16/22   (2006.01)

(52) U.S. Cl.
   CPC ............ *G11C 5/14* (2013.01); *G06F 12/0246* (2013.01); *G11C 16/225* (2013.01); *G06F 2212/1016* (2013.01); *G06F 2212/7203* (2013.01); *G06F 2212/7205* (2013.01)

(58) Field of Classification Search
   None
   See application file for complete search history.

(56) References Cited

U.S. PATENT DOCUMENTS

| | | | |
|---|---|---|---|
| 5,602,987 A | 2/1997 | Harari et al. | |
| 6,181,630 B1* | 1/2001 | Caulkins | 365/228 |
| 6,704,835 B1* | 3/2004 | Garner | 711/103 |
| 6,707,748 B2* | 3/2004 | Lin et al. | 365/228 |
| 6,977,847 B2 | 12/2005 | Lasser et al. | |
| 6,990,594 B2* | 1/2006 | Kim | 713/322 |
| 7,003,620 B2 | 2/2006 | Avraham et al. | |
| 7,113,432 B2 | 9/2006 | Mokhlesi | |
| 7,774,390 B2* | 8/2010 | Shin | 707/814 |
| 2006/0218362 A1* | 9/2006 | McManis | 711/162 |
| 2007/0061502 A1* | 3/2007 | Lasser et al. | 711/103 |

* cited by examiner

*Primary Examiner* — Eric S Cardwell
(74) *Attorney, Agent, or Firm* — Foley & Lardner LLP (57) ABSTRACT

A memory device and techniques for its operation are presented. After operating on power received from a host, the memory device determines that it is no longer receiving host power and, in response, activates a power source on the memory device itself. Using this reserve power, the memory device can then perform data management operations. The techniques can also be applied to a digital appliance having a non-volatile memory. The memory device or digital appliance can prioritize its memory management operation during the host/user operating window based on the ability to perform these operations outside of the host/user operating window. Additionally, in a data write operations, where the memory device receives data from a host, stores the data in volatile memory, and then writes the data into the non-volatile memory, the memory device sends the host an acknowledgment of the data having been written into the non-volatile memory after it has been store in the volatile memory, but before the write into the non-volatile memory is complete.

10 Claims, 4 Drawing Sheets

LEVERAGING PORTABLE SYSTEM POWER TO ENHANCE MEMORY MANAGEMENT AND ENABLE APPLICATION LEVEL FEATURES

FIELD OF THE INVENTION

This invention pertains generally to the field of non-volatile memory systems and, more particularly, to improvements in memory usage through uses of a portable power system included with the memory system.

BACKGROUND

Current non-volatile memory systems generally perform a number of housekeeping operations, such as garbage collection or various data management operations related to the use large blocks, as part of their data management operations. Since portable memory devices typically do not have their own independent power, they rely upon host power to perform these operations. Because the memory needs to be assured of the power supply during these operations, these are usually performed while the host is actively engaged with the memory device, being interspersed during data transfer operations. Consequently, this can result in a loss in performance.

SUMMARY OF THE INVENTION

According to one set of aspects, a non-volatile memory device and techniques for its operation are presented. After operating on power received from a host, the memory device determines that it is no longer receiving host power and, in response, activates a power source on the memory device itself. Using this reserve power, the memory device can then perform data management operations.

According to other aspects, after a digital appliance having a non-volatile memory is operated in a first, or "on", mode, where the user can access data from the non-volatile memory, the digital appliance is powered down. In response to the powering down, the digital appliance operates in a second, or "off", mode, where the user cannot access the non-volatile memory, but in which the digital appliance can then perform data management operations on the memory.

In yet other aspects, the memory device or digital appliance can prioritize its memory management operation during the host/user operating window based on the ability to perform these operations outside of the host/user operating window.

In still further aspects, in a data write operations, where the memory device receives data from a host, stores the data in volatile memory, and then writes the data into the non-volatile memory, the memory device sends the host an acknowledgment of the data having been written into the non-volatile memory after it has been store in the volatile memory, but before the write into the non-volatile memory is complete.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

The various aspects and features of the present invention may be better understood by examining the following figures, in which.

DETAILED DESCRIPTION

The techniques described here can enable the system to maintain data on non-volatile memory in a more reliable manner while reducing the amount of housekeeping performed during user/host operation. Such operations often involve storing management data, user data, or both in volatile memory. For example, many involve reading data out of non-volatile memory, rearranging it, and writing back into the non-volatile memory. To be able to execute these operations confidently, the memory needs to know that its power supply will be maintained. As the traditional power source for a memory card and other such detachable device is a hosting digital appliance to which it is connected, the memory could only execute such operations when the host is also engaging the card, as it then has some expectation of the power supply remaining available. The present invention introduces an on-device power supply so that part or all of the various data management operations can be moved out of the host/user operation window. Further, the various memory management algorithms can be adjusted to exploit this ability even when operating within the host/user operation window.

The data management operations to which the following techniques can be applied include, but are not limited to, performing wear leveling (see, e.g., US patents or publications U.S. Pat. Nos. 6,230,233; 6,985,992; 7,120,729; or 2006-0106972), controller data refreshes and updates (see, e.g., U.S. application Ser. No. 11/535,853 or U.S. Pat. No. 5,532,962), read re-assign and phased garbage collection (see, e.g., US patents or publications 2006-0020745; 2005-0144365; 2005-0166087; 2005-0141312; 2005-0141313; or U.S. Pat. No. 7,139,864) after a user/host has discontinued use of the device by removing external power or using the power off switch. The device can also leverage offline power to perform application level file backup/archiving, data integrity checks and any housekeeping (see, e.g., US patent publications 2006-0184720; 2005-0154819; 2007-0143561; or application Ser. Nos. 11/302,764; 2007-0033375; 11/537,243; 11/616,242; 11/616,231; 11/616,226) that the application can perform outside of user/host operation.

Another data management operation where the described techniques can be used in the sort of data caching method described in U.S. Pat. Nos. 5,930,167 and 7,177,184 and U.S. patent application Ser. No. 11/318,906, where data is first written into non-volatile memory while treating it as binary memory (for increased speed, robustness, or both), and then later reformatted into multi-state format (for greater storage density) and rewritten into the non-volatile memory. By again leveraging on-board power, the memory can help to mitigate the impact on data transfer performance during this binary to multi-state repackaging, even though multi-state memory write operations are more complicated and time-consuming.

Additionally, this ability to have a reliable on-device power source can be used to alter other operating algorithms within the user/host operation window. A particular example is a host write operation. Instead of needing to wait until a unit of data is successfully written into non-volatile memory before send an acknowledgement back to the host, this acknowledgement can now be sent to the host once cached in volatile buffer memory. The early acknowledgement is possible as the on-device power source allows the write to be completed outside of the host/user operation window, should this become necessary.

Before proceeding to explain the different approaches, the user/host operation window is described. The user/host operation window is that period of time where the device either is connected to a host and should expect read/write or other commands to be issued at any time or is being used by a user, where the concept of a host does not apply. (For example, an MP3 player where the user is either playing or browsing through device content.) Previous approaches have only addressed integrity and controller data upkeep issues on flash or other non-volatile memory by managing these within the user/host operation window. As discussed above, the limitations imposed on the system by this restriction is that all such operations must be completed while the device is powered on and used, or that if such operations are interrupted by switching off/removing power, then the system must recover gracefully upon a subsequent power up/power on by performing a scan of key control structures during power-on and take necessary corrective action.

The techniques described here are widely applicable, both for portable devices, such as memory cards, that are primarily used with a hosting digital appliance, and also digital appliances which themselves include non-volatile memory, such as embedded flash. Example of such digital appliances include desktop, notebook or laptop tablet computers, personal digital assistants (PDAs), mobile phones, a variety of media players such as MP3 players, DVD players, gaming consoles, digital recording devices such as digital cameras, and others. Suitable memory cards are available from SanDisk Corporation, the assignee hereof, which include those sold under trademarks CompactFlash (CF), Multi-Media Card (MMC), Secure Digital (SD), MicroSD and Memory Stick PRO. These memory cards are removably connected with digital appliances through mating connectors that are different for most cards. SanDisk Corporation flash drives, sold under the Cruzer trademark, contain a plug according to the Universal Serial Bus (USB) standard, so can be plugged directly into any digital appliance having a USB receptacle. TrustedFlash cards and other secure cards (SIM, SMMC, SD, etc) allow secure storage of the both licenses and associated content. Also the following discussion will often refer to non-volatile memory as flash, the techniques given here are not so limited and more generally apply to other non-volatile memory structures (such as described in U.S. patent application Ser. No. 10/841,379, for example), for both portable devices and embedded memories.

Figure 1:
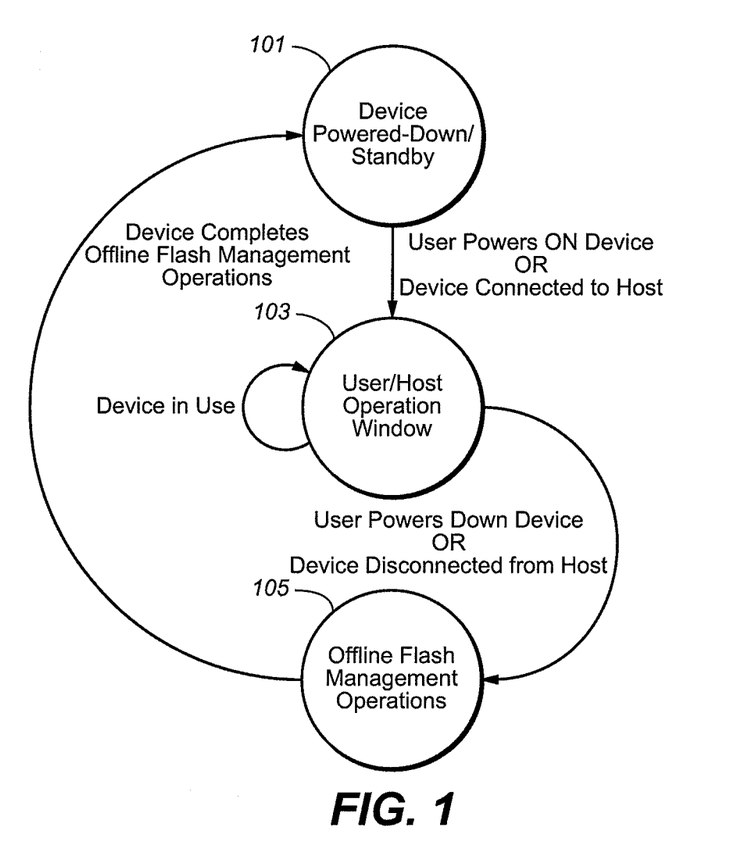
FIG. 1 is a state diagram to illustrate the concept of the user/host operation window.

According to one aspect of the techniques presented here, the limitations imposed upon a memory system by the requirement that they be performed during the user/host operating window can by-passed or mitigated by including on-board power (or, if it is already available, leveraging it) and include suitable power management logic to handle multiple power sources. Such power management logic would typically be implemented through a combination of hardware and firmware; for example, the hardware for detection of power loss and possibly for automatic switching to backup power, and the firmware, to monitor the power source and initiate the appropriate actions. A second aspect is to further exploit the backup power by modifying device functionality and implementing existing algorithms (and new ones, potentially) to bolster memory management and possibly add application level feature enhancements. This modified functionality implementation can then perform some or all of the requisite and additional management operations outside of the user/host operation window. FIG. 1 is state diagram that illustrates the chronology of events within which the various aspects can be used.

In FIG. 1, the standby state is at 101, where the device is powered down or in standby mode. When a user powers on the device, or connects in to a host and it autostarts, it enters the user/host operation window, 103, where the device is actively in use. This state 103 is then left when the user powers down the device (for example, turning of an MP3 player) or the device is disconnected from host (such as removing a memory card), whether as part of a proper or improper shutdown. Under prior art arrangements, since the various housekeeping and data management operations a memory performs, which often involve the use of some amount of volatile memory for user data, control data, or both, require confidence that power will be maintained, these were performed during state 103. For instance, the controller on the memory system would wait until host initiated an operation within whose duration a particular housekeeping operation could be executed.

The ability to have access to a portable or reserve power source allows these various data management operations to be treated differently, even when performed while in the user/host operation window, since there is now the option to delay the execution until the device is no longer in use or otherwise operation without the need to be assured that host power will be available for the duration of the operation. Consequently, the memory can also adjust operations within the user/host operation window 103 to take advantage of this capability, such by adjusting various algorithms or timing of operations. Previously, when non-volatile memory systems, such as memory cards, have considered the inclusion of an on-memory auxiliary power source, this was for use as an emergency backup in case of an improper shutdown or power loss to provide the ability to save user or system data held in cache or other volatile memory. (Examples of memories that may include such backup powers are given in U.S. Pat. Nos. 5,602,987; 7,113,432; 6,977,847; and 7,003,629.)

Once powering down, the device goes into offline Flash (in the exemplary embodiments) management operation state 105, at which the secondary power mode is invoked. The user/host would not be issuing any commands at this state. If the user/host does issues commands, the offline management window would then end and the host would return (not shown) to the user/host operation window. The device can then enter a special power state, not lowered to the level of powering everything down, but an intermediate state where components not needed in completing the various operations to be executed are powered off. This can include components such as the controller and its interfaces, which can be throttled back to elongate backup power life. Once the device completes the offline management operations, it can then return to the standby state 101.

The operations in the offline management operation state 105 will require a finite amount of time and power. Low power battery solutions exist such as thin film batteries (for small form factors devices such as uSD or M2 Pro Duo or USB Stamp) or coin cells (for larger device form factors), which should be sufficient for the proposed operations. The battery can be recharged when a powered host is connected or external power is applied. As an example of capacity requirements, 200 ms of operation needing 100 mA requires something like a 5.6 µAh battery. For reference, coin cells run in the milliamp-hour range and something like an AA alkaline battery offers up to 2800 mAh.

Figure 2A:
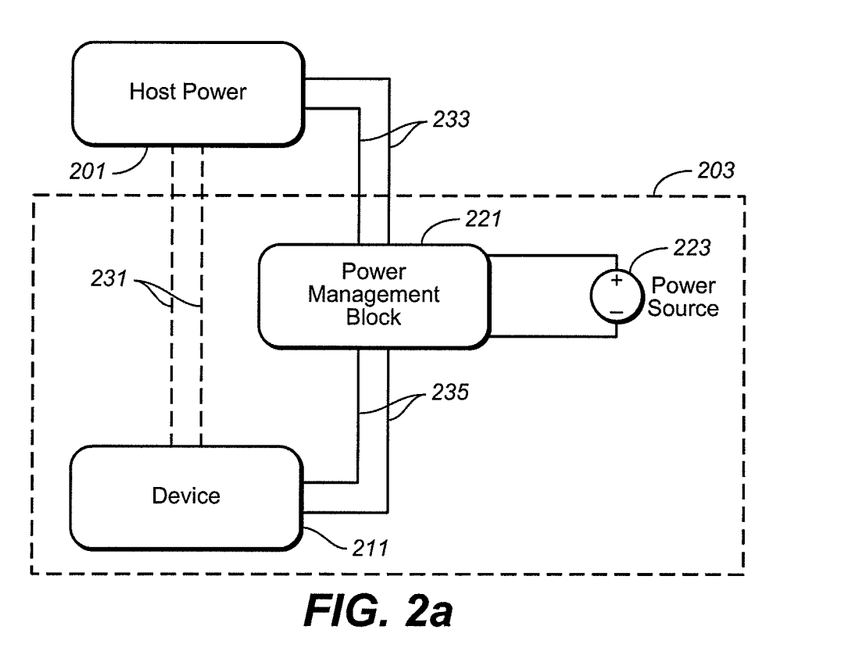
FIGS. 2a and 2b are top-level block diagrams for a device with offline memory management capabilities.

FIG. 2a is a block diagram of a memory device with offline management capabilities. As shown, this has a host 201, including the host power system, connected to a memory system 203. The memory system 203 itself will be such as the memory systems presented in any of the various references cited herein, except that instead of just the usual elements (represented by the box device 211), it will now also include power management block 221 and power source 223. Although the power management block 221 is shown here, for purposes as discussion, as separate from the device 211, it can also be incorporated into the controller of device 211, rather than a separate element inside the system 203. The device 211 will typically be formed of a control circuit, one or more memories, a host interface, and so on, which are not shown here to simplify the discussion—for more detail see, for example, FIG. 1 of U.S. Pat. No. 7,113,432, which also shows a reserve power source. As also shown, the device 211 receives host power along 231 in normal operating mode. The power management block can also receive host power along 233, which can then be used to change and maintain the on-device power source 223. When the on-device power source 223 is used, power is then supplied along 235 to the device 211. (The various other host-memory connections, such as discussed in the various cited references, are suppressed here to simplify the discussion. More detail is found in the various cited references.)

Figure 2B:
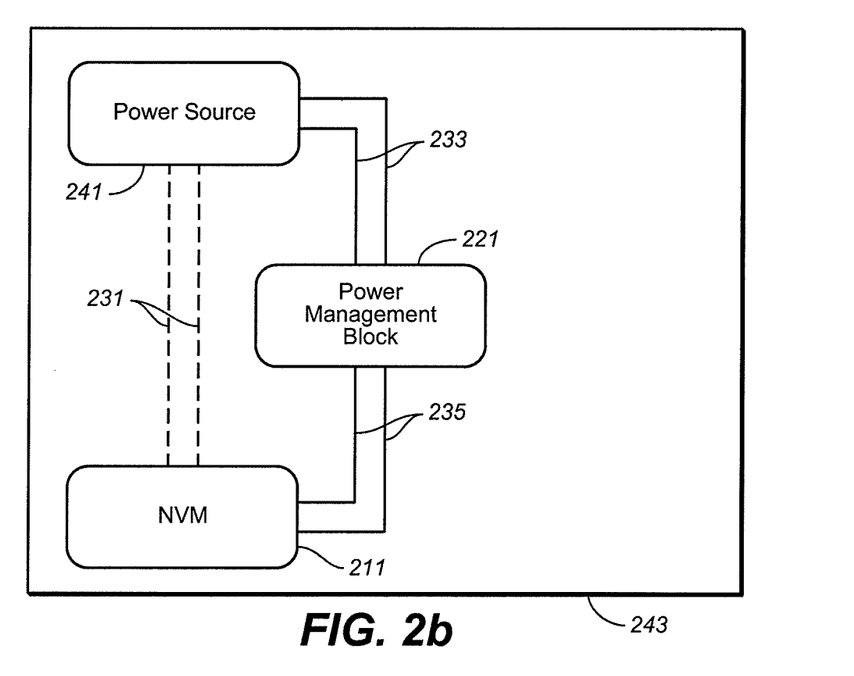
Figure 3:
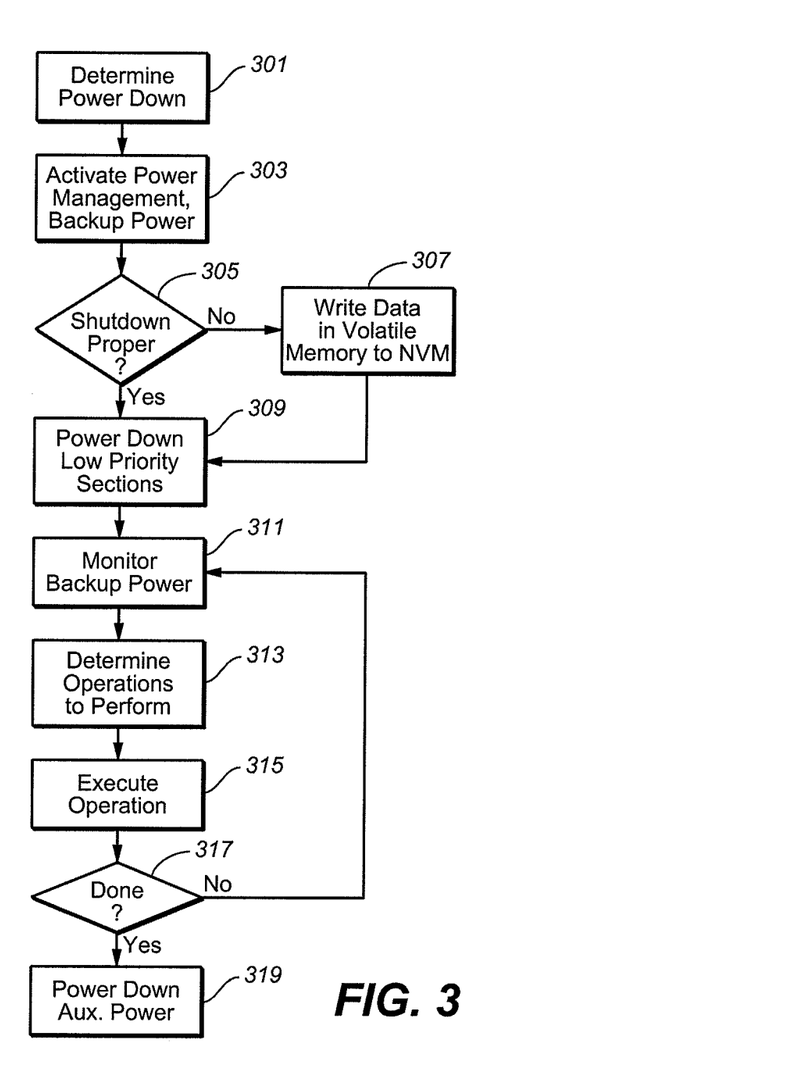
FIG. 3 is flow for one exemplary embodiment of some aspects of offline management.

FIG. 3 shows an embodiment based on a host and a separate memory system, such as a digital appliance (e.g., digital camera) and detachable memory card, where under the typical prior art arrangement the memory device lacks an autonomous power source. In such an embodiment, when the portable device 203 is being used with the host 201, it has access to the host's power; when the memory card (or other device) 203 is detached electrically from the host, it loses access to host power. As noted above, in other embodiments, the memory device may be part of the digital appliance, such as an embedded memory in an MP3 player, for example. This is shown in FIG. 2b, where the digital appliance is labeled 243 and where the flash or other non-volatile memory is now labeled NVM, the host power is labeled 241, and the other elements labeled as in FIG. 2a. In these alternate embodiments, there need not be an additional power source, such as shown at 223, but the host's power source 241 may instead be used in the offline mode. In this case, the power management block 221 used when outside of the user/host operation window may not be an actually physically separate element, but rather be implemented with the digital appliance's power management hardware or firmware. Although most to the discussion here is given in terms of the host/detachable memory system embodiments shown in FIG. 2a, the discussion readily extends to the unified digital appliance embodiments such as in FIG. 2b. (For instance, many embedded flash memories utilize algorithms are taken over from detachable memory cards.)

The suitable power management logic incorporated into the power management block 221 can be implemented in hardware, firmware, or a combination of these. This can be implemented as a separate physical element in the memory system 203, or through (or combined with) an upgrade or modification of existing memory management logic and hardware. The added programming and management logic is then used to implement the various the firmware/behavioral changes described below.

FIG. 3 is a sample flow into which the various aspects of the present invention can be incorporated. This would begin at 301 where a power down is determined. For example, in the case of a portable device, such as a memory card or USB drive, this could be when it is shut down the user, disconnected from a host, or otherwise loses power. In the case of a digital appliance, this could be when the user turns the device off. Once the power down is detected, the offline power management are mode is entered and, in embodiments such FIG. 2a, backup power invoked.

As the shutdown may or not have been improper, the memory may want to determine this (305) and, if needed, take appropriate actions, such as saving any data, whether user data or control data, into non-volatile memory (NVM) (307). (Such operations are described in more detail in U.S. Pat. No. 5,602,987; 7,113,432; 6,977,847; and 7,003,629.) This could also include the sort of operations described below with respect to FIG. 5. Although elements 305 and 307 are optional (or, rather, independently implementable) in this flow, it may be preferable to give such operations to save data in volatile memory priority over the various management operation described more below. Additionally, although 305 and 307 are shown here as immediately after 303 for purposes of discussion, they can also before during or after elements 309, 313 and others. For example, the operations of 307 could be some of those prioritized at 313 and performed at 315, which may facilitate some operations as data needing to be cached for a particular management operation may already be buffered in the controller.

Moving on to 309, it may be preferable to power down low priority sections of the memory device. The memory can then prioritize and determine which operations to perform (313) and then execute these (315) while monitoring the status of the on-memory power source (311). This can continue until the selected operations are complete (317), at which point the system can power down the auxiliary power (319). Several examples of the sort of operations that can be performed are described in the following, which provides more detail on various aspects of the flow. It should be noted that various operations, although described somewhat separately are not mutually exclusive and can be incorporated together into operations 311-319.

Although not addressed in FIG. 3, it may occur that at some point in this process, the user/host operation window is re-entered before 319 is reached. For example, a memory device could be reattached to a host or a user could power back up a digital appliance. In this case, any operations under way could then be completed in the off-line mode, completed in the on-line mode prior to any new operations, or incorporated into any new operations.

Although many of the following data management operations can be executed within the host/user operation window, in the offline mode, or in some combination of the two, differing algorithms may be employed for the same operation depending on the mode. For instance, while in the host/user operation window, there is usually more power available, but speed may important; consequently, a more power intensive, but faster algorithm may be used. In contrast, in the offline mode, there is generally no particular hurry and lower power algorithms can be used. For example, read or write operations may be performed differently by, for example, reducing the amount of parallelism.

A first set of embodiments relate to improvement in the management of the non-volatile memory on the device. Operations such as phased garbage collection, read scrub, read-reassign, file system refresh and additional data management operations can be readily performed even though the device is not connected to a host or not executing a command. A basic usage model is as follows: First, the user/host exercises the device through any number of standard operations, such as reading data, writing data, running applications, and so on. At this time, during the host/user operation window, the device functionality can be such that any flash management operations that are not explicitly necessary to execute the needed user/host commands need not be performed. The user/host stops using the device, which then transitions to the offline mode.

Once in the offline mode, the power management logic and device firmware can be activated to power down sections that are not necessary, like the host side interface hardware, displays, LED, audio drivers, wireless components etc. The logic and firmware can then monitor the back-up battery's status and, if satisfactory, continue or else wait for the next user/host operating window and provide details of the condition via a flag or error log. Control data structures/tables can then be scanned to determine the operations that need to be performed. If required, the logic/firmware can establish priority for these operations and defer some that are not immediately required. An example of this would be to realize that it is very important to refresh the file system, while performing a read scrub operation on a particular block is not as critical and to schedule a files system refresh (such as updating parameters, settings, or logs) with a higher priority. The memory will continue to monitor power usage and control the number and scope of operations. Once it has finished performing these operations, the system can gracefully power down and wait to enter the next user/host operating window.

In a similar fashion, application level operations (file/data archiving/compaction) can be initiated when the device exits the user/host operating window. Once the user/host stops using the device, the power management logic and firmware are activated. Data structures and task lists can then be scanned to identify what is to be done. For example, if the user had viewed/modified contacts on his MP3/media player, the player could create an updated backup of the contacts. The logic/firmware can then monitor power usage and maintain control over operations. After such archiving activities are completed, the device can gracefully power down and wait to enter the next user/host operating window.

As another set of examples, there are techniques of initially writing data into non-volatile memory in a binary form, which is faster, and then coming back and re-writing in multi-state form, which is denser. This idea of data caching by using the non-volatile memory itself as temporary binary storage before the data is copied from binary to multi-state, is discussed, for example in U.S. Pat. Nos. 7,177,184 and 5,930,167 and application Ser. No. 11/318,906. Since such a process requires the data to be read out, temporarily held in volatile memory, and then rewritten, to minimize risk of this data being lost while this is going on, prior art arrangements would need the assurance of continued host power, which would mean that the host was already engaged in an operation with the memory, and which, in turn, would affect the performance of this host operation. By being able to use the power supply in the offline mode, such a "folding operation" can be confidently executed without having to completing during, for example, a write command, where in addition to affecting the performance of the writing of data from the host, it is also limited to a certain amount of write data due to buffering capabilities. Instead, the device can continue to accept host data and store it as binary up to a predetermined fraction of its configured binary blocks.

For example, suppose a user writes 1 MB of data to a memory device that uses this binary, non-volatile caching. The device will absorb the 1 MB of data at binary speeds to a section of memory configured as binary. Under previous implementations, the memory will need to reconfigure the 1 MB of data into a multi-state format and write it to memory blocks configure for multi-state before the end of the host initiated transfer. For example, this would include: a) Host issues write command for 1 MB; b) Host transfers 1 MB of data that the device writes to binary blocks as a temporary measure; and c) Before issuing the status back to the host, the device transfers this data to multi-state blocks as an internal operation, elongating the execution time for the write command.

The extra complications introduced by step c) can be avoided by invoking the reserve power of the offline mode, since it no longer need be necessary to perform or complete the folding operation during he user/host command execution timeframe. The extent to which this operation can be delayed may be limited based on the predetermined fraction of memory blocks allocated to be used as binary blocks in the memory. Because of this, in some cases only a faction of the data (up to, say, the equivalent of 50% of the memory blocks) can be continuously written to by the host in this manner before folding/write-through step (c) above) has to be performed within the user/host operating window. In any case, the availability of the offline mode can be used to maintain data integrity for the binary to multi-state rewrite of this folding process.

As already noted, the ability to rely upon the auxiliary power source or node in case of the loss of primary power can be exploited in the scheduling of data management operations. According to another aspect presented here, it can also be used during the transfer of data between a host and the non-volatile memory system.

In a typical write of data from a host in a non-volatile memory, the write has several step. A segment of the data is transferred from the host to the memory, where it is first received at the controller and cached. From the controller, it is then transferred on to the memory portion of the memory system where it is buffered in registers until it is successfully written into the non-volatile array. Only once the data segment is successfully written into the non-volatile memory is an acknowledgment sent to the host. To do so sooner would risk the host thinking the data is safely stored when this may not be so. This situation is illustrated in FIG. 4.

Figure 4:
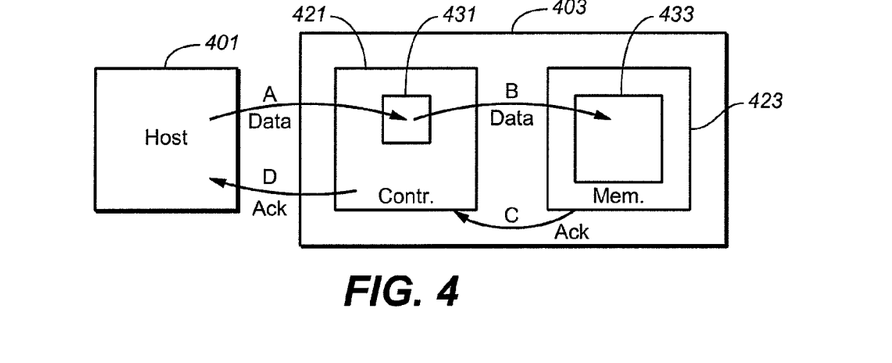
FIGS. 4 and 5 are block diagrams for a typical host write to a non-volatile memory device, with the second of these showing the early acknowledgement feature

FIG. 4 is a schematic representation of the process as usually found in the prior art. FIG. 4 shows a host 401 and a memory device 413. The memory device 413 has controller 421 with a volatile cache memory 431 for buffering data and one or more memories such as 421, each having one or more memory arrays 433. When the host 401 wants to write data into the non-volatile memory 433, it is first transferred to the controller ("A"), where it is buffered at 431. Once stored in 431, it can then (based on bandwidth and availability) be transferred into the memory ("B"). On the memory 423 itself, the unit of data is typically first transferred into a volatile register or buffer (not shown), from which it is written into the non-volatile array 433.

Only once the unit of data is successfully written into an array is an acknowledgement sent ("C") from the memory 423 to the controller 421, which is then relayed on to the host ("D"). In particular, segment B may take a relatively long time, not just for the actual programming of data, but in some cases there may be a wait for previous units of data to finish program or for available memory space to be opened up by an erase or other operation. Although various methods for pipelining parts of the write operation are known (see, for example, U.S. Pat. Nos. 6,871,257 or 7,120,051), there is still the need for each of segments A, B, C, and D to be completed before this acknowledgement is received back, which can slow down the transfer rate. To do so sooner would risk the possibility that the data could be lost in case of improper shut down, but with the host thinking the write was successful.

In contrast, by incorporating the availability of the on-device reserve power source or reserve mode, the order of events in FIG. 4 can be changed. Once a unit of data has been transferred from the host onto the controller, it can now be treated as safely stored on the memory system since, in case of shutdown (whether proper or not), the reserve power can be invoked to finish the write process to the non-volatile memory. Therefore, once a unit of data has been buffered in the cache, the memory device can send to the host an acknowledgement that the unit of data is fully written. This early acknowledgment can be sent at the same time or before transferring the data unit on from the controller to the memory.

Figure 5:
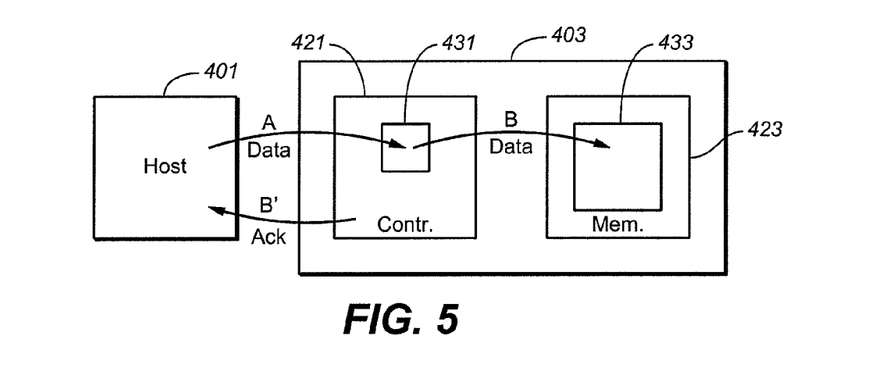

The early acknowledgment concept is illustrated conceptually in FIG. 5. The various elements of FIG. 5 are the same as in FIG. 4. Segments A and B are also the same; however, now, rather than wait for the completion of segment B to send the host an acknowledgment, this can now be done ("B'") once A is complete.

In the case of a digital appliance with an embedded non-volatile memory, such as shown in FIG. 2b, a similar process can be used, except in this case, element 403 would refer to the digital appliance itself, which would buffer data in a non-volatile memory (431) prior to writing it in flash or other non-volatile memory (433). In this case, element 401 would be the data source. For example, this could represent an MP3 player copying music from a PC or the internet into an embedded flash memory. Much as described with respect to FIG. 5, the digital appliance could send an early acknowledgement to the data source once the memory was buffer in a volatile cache.

Although some of the prior art references noted above (specifically U.S. Pat. Nos. 5,602,987; 7,113,432; 6,977,847; and 7,003,629) note the possibility of using a reserve power source to save to non-volatile memory data cached in volatile memory, this is done in response to an improper shutdown, whereas here this ability is being used to change the behavior of the memory system while still attached to the host. Under the arrangement presented here, if there were a power down (whether proper or not) after segment B', but prior to the completion of B, segment B could be completed first before moving on to other data management operations in order to improve the robustness of the memory. (This particular prioritization is shown in the optional portions 305 and 307 of FIG. 3, as discussed above.)

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

It is claimed:

1. A method of operating a device having a non-volatile memory for storing user data, the device having a first operating mode for user operations, in which a user can access user data stored in the non-volatile memory and the device can perform data management operations, and a second operating mode, wherein the device is powered down as seen by the user and wherein the user cannot access user data stored in the non-volatile memory, the method comprising:
    prioritizing, while operating in the first mode, a plurality of management operations to perform on data stored in the non-volatile memory, the prioritizing including scheduling one or more of said data management operations to be performed while the device is in the second operating mode;
    powering down of the device; and
    subsequently determining and beginning one or more of the scheduled data management operations during the second operating mode.

2. The method of claim 1, wherein said device is a non-volatile memory device for use with a host to store data therefrom, wherein during the first mode the memory device is connected to a host to receive and operate on power therefrom and during the second mode the memory device uses a reserve power source on the memory device.

3. The method of claim 1, wherein said device is a digital appliance including the non-volatile memory for storing user data.

4. The method of claim 1, wherein during the second mode, the device powers down one or more components not required to perform the scheduled data operations during the second operating mode.

5. The method of claim 1, wherein in response to a user input, the device returns to the first mode.

6. A device comprising:
    a non-volatile memory for storing user data;
    a power source; and
    control circuitry connectable to non-volatile memory and the power source to manage the storage of data on the non-volatile memory using power from the power source, wherein, the control circuitry can manage the non-volatile memory in a first operating mode for user operations, in which a user can access user data stored in the non-volatile memory and the device can perform data management operations, and a second operating mode, wherein the device is powered down as seen by the user and wherein the user cannot access user data stored in the non-volatile memory, and
    wherein, while operating in the first mode, the control circuitry prioritizes a plurality of management operations to perform on data stored in the non-volatile memory, the prioritizing including scheduling one or more of said data management operations to be initiated while the device is in the second operating mode.

7. The device of claim 6, wherein said device is a non-volatile memory device for use with a host to store data therefrom and said power source is a reserve power source on the memory device, wherein during the first mode the memory device is connected to a host to receive and operate on power therefrom and during the second mode the memory device uses the reserve power source.

8. The device of claim 6, wherein said device is a digital appliance including the non-volatile memory for storing user data.

9. The device of claim 6, wherein during the second mode, the device powers down one or more components not required to perform the scheduled data operations during the second operating mode.

10. The device of claim 6, wherein in response to a user input, the device returns to the first mode.

* * * * *